(12) United States Patent
Min et al.

(10) Patent No.: US 11,094,649 B2
(45) Date of Patent: Aug. 17, 2021

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Fan-Yu Min, Kaohsiung (TW); Chen-Hung Lee, Kaohsiung (TW); Hsiu-Chi Liu, Kaohsiung (TW); Liang-Chun Chen, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/748,559

(22) Filed: Jan. 21, 2020

(65) Prior Publication Data
US 2021/0225781 A1    Jul. 22, 2021

(51) Int. Cl.
| | |
|---|---|
| *H01L 23/495* | (2006.01) |
| *H01L 23/00* | (2006.01) |
| *H01L 23/31* | (2006.01) |
| *H01L 21/48* | (2006.01) |
| *H01L 21/56* | (2006.01) |

(52) U.S. Cl.
CPC ........ *H01L 23/562* (2013.01); *H01L 21/4857* (2013.01); *H01L 21/561* (2013.01); *H01L 21/568* (2013.01); *H01L 23/3128* (2013.01)

(58) Field of Classification Search
CPC . H01L 21/561; H01L 21/568; H01L 21/4857; H01L 23/562; H01L 23/3128
USPC .......................................................... 257/668
See application file for complete search history.

(56) References Cited

U.S. PATENT DOCUMENTS

| | | | | |
|---|---|---|---|---|
| 7,786,569 | B2 * | 8/2010 | Nakagawa | ........ H01L 23/49838 257/700 |
| 7,868,446 | B2 | 1/2011 | Meyer | |
| 8,129,828 | B2 * | 3/2012 | Maeda | .................... H01L 23/16 257/678 |
| 8,530,751 | B2 * | 9/2013 | Maeda | ................ H01L 21/4857 174/258 |
| 9,425,121 | B2 * | 8/2016 | Tsai | ........................ H01L 24/97 |
| 9,449,953 | B1 * | 9/2016 | Shih | ........................ H01L 25/50 |
| 10,256,114 | B2 * | 4/2019 | Huemoeller | ........ H01L 21/4857 |
| 10,319,607 | B2 * | 6/2019 | Wu | ...................... H01L 23/3128 |
| 10,707,181 | B2 * | 7/2020 | Kim | .................... H01L 23/3142 |
| 2010/0327421 | A1 * | 12/2010 | Luan | ........................ H01L 23/16 257/687 |

* cited by examiner

*Primary Examiner* — Luan C Thai
(74) *Attorney, Agent, or Firm* — Foley & Lardner LLP

(57) ABSTRACT

Present disclosure provides a semiconductor package structure, which includes a redistribution layer (RDL) structure, an electronic device, a first reinforcement structure, a second reinforcement structure, and an encapsulant. The RDL structure has a passivation layer and a patterned conductive layer disposed in the passivation layer. The electronic device is disposed on the RDL structure. The first reinforcement structure is disposed on the RDL structure and has a first modulus. The second reinforcement structure is disposed on the first reinforcement structure and has a second modulus substantially less than the first modulus. The encapsulant is disposed on the RDL structure and encapsulates the electronic device, the first reinforcement structure and the second reinforcement structure.

26 Claims, 30 Drawing Sheets

US 11,094,649 B2

1

SEMICONDUCTOR PACKAGE STRUCTURE AND METHOD FOR MANUFACTURING THE SAME

TECHNICAL FIELD

The present disclosure relates to semiconductor package structures.

DESCRIPTION OF THE RELATED ART

A semiconductor package structure can include a semiconductor device disposed on a carrier and encapsulated by an encapsulant.

However, the semiconductor package structure may warp due to characteristics of different materials (e.g. carrier material and encapsulant).

SUMMARY

In some embodiments, the present disclosure provides a semiconductor package structure, which includes a redistribution layer (RDL) structure, an electronic device, a first reinforcement structure, a second reinforcement structure, and an encapsulant. The RDL structure has a passivation layer and a patterned conductive layer disposed in the passivation layer. The electronic device is disposed on the RDL structure. The first reinforcement structure is disposed on the RDL structure and has a first modulus. The second reinforcement structure is disposed on the first reinforcement structure and has a second modulus substantially less than the first modulus. The encapsulant is disposed on the RDL structure and encapsulates the electronic device, the first reinforcement structure and the second reinforcement structure.

In some embodiments, the present disclosure provides a semiconductor package structure which has a barycenter. The semiconductor package structure includes a passivation layer, an electronic device, an encapsulant, and a first reinforcement structure. The electronic device is disposed on the passivation layer and has a first surface adjacent to the passivation layer. The encapsulant encapsulates the electronic device and has a first surface adjacent to the passivation layer and a second surface opposite the first surface. The first reinforcement structure is disposed adjacent to the second surface of the encapsulant. An imaginary surface which is substantially in parallel to the first surface of the electronic device passes the barycenter of the semiconductor package structure. The first reinforcement structure is disposed on the imaginary surface.

In some embodiments, the present disclosure provides a method for manufacturing a semiconductor package structure, the method includes providing a carrier; disposing a number of electronic devices on the carrier; disposing a number of first reinforcement structures on the carrier; disposing a second reinforcement structure on each of the number of the first reinforcement structures; forming an RDL structure on the number of electronic devices and the second reinforcement structures; and encapsulating the number of electronic devices, the number of first reinforcement structures, and the second reinforcement structures.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1:
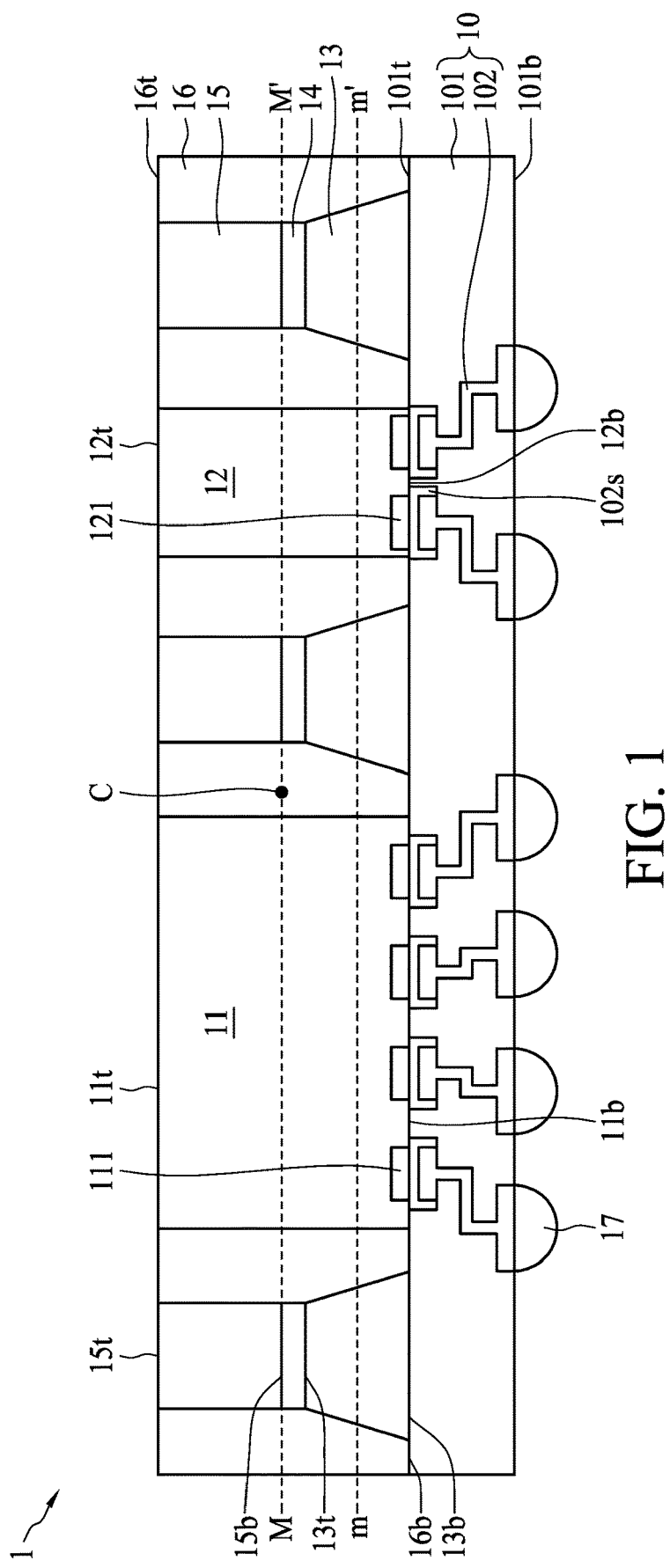
FIG. 1 illustrates a cross-sectional view of a semiconductor package structure in accordance with some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1 illustrates a cross-sectional view of a semiconductor package structure in accordance with some embodiments of the present disclosure.

Referring to FIG. 1, the semiconductor package structure 1 can include a carrier 10, electronic devices 11 and 12, reinforcement structures 13 and 15, a bonding layer 14, encapsulant 16 and connection elements 17. The semiconductor package structure 1 can have a centroid, a center of mass, or a barycenter C.

The carrier 10 can include, for example but is not limited to, a substrate, a leadframe, a printed circuit board (PCB), a redistribution layer (RDL) structure. The carrier 10 can include an RDL structure, which includes an insulation layer or passivation layer 101 and a conductive circuitry 102. The conductive circuitry 102 can include a patterned conductive layer (not denoted in FIG. 1). The conductive circuitry 102 can be disposed or embedded in the passivation layer 101.

The passivation layer 101 can include, for example but is not limited to, polymide (PI) or other suitable dielectric material(s). The passivation layer 101 can have a coefficient of thermal expansion (CTE) ranged from approximately 50.0 ppm/° C. to approximately 70.0 ppm/° C. The passivation layer 101 can have an upper surface 101t. The passivation layer 101 can have a lower surface 101b opposite the surface 101t. The conductive circuitry 102 can include conductive trace(s). The conductive circuitry 102 can include conductive via(s). The conductive circuitry 102 can include conductive pad(s).

The conductive circuitry 102 can include a seed layer 102s. The seed layer 102s can have a single layer structure. The seed layer 102s can have a multilayer structure. The seed layer 102s can include a layer of conductive material. The seed layer 102s can include a layer of copper (Cu). The seed layer 102s can include a layer of titanium (Ti). The seed layer 102s can include Cu and Ti.

The electronic device 11 can include a semiconductor chip or a semiconductor die. The electronic device 11 can include an integrated circuit. The electronic device 11 can include conductive pads 111. The electronic device 11 can have an upper surface 11t. The electronic device 11 can have a lower surface 11b opposite the surface 11t. The surface 11b is adjacent to the carrier 10.

The electronic device 11 can be disposed on the carrier 10. The electronic device 11 can be electrically connected to the carrier 10. The electronic device 11 can be electrically connected to the conductive circuitry 102 via the conductive pads 111. The conductive pads 111 can be in direct contact with the seed layer 102s.

The electronic device 12 can be similar to the electronic device 11. The electronic device 12 can include a semiconductor chip or a semiconductor die. The electronic device 12 can include an integrated circuit. The electronic device 12 can include conductive pads 121. The electronic device 12 can have an upper surface 12t. The electronic device 12 can have a lower surface 12b opposite the surface 12t. The surface 12b is adjacent to the carrier 10.

The electronic device 12 can be disposed on the carrier 10. The electronic device 12 can be electrically connected to the carrier 10. The electronic device 12 can be electrically connected to the conductive circuitry 102 via the conductive pads 121. The conductive pads 121 can be in direct contact with the seed layer 102s.

The reinforcement structure 13 can include, for example but is not limited to, glass or other relatively rigid, hard, or solid material. The reinforcement structure 13 can have a CTE ranged from approximately 3.0 ppm/° C. to approximately 6.0 ppm/° C. The reinforcement structure 13 can have a Young's modulus (or Young modulus) greater than approximately 70.0 gigaPa (Gpa).

The reinforcement structure 13 can be disposed on the carrier 10. The reinforcement structure 13 can be in direct contact with the surface 101t of the carrier 10. The reinforcement structure 13 can have a portion 13b adjacent to the carrier 10 (or the RDL structure 10). The reinforcement structure 13 can have a portion 13t on the portion 13b. The portion 13b has a width substantially greater than the portion 13t. The reinforcement structure 13 can have a trapezoid profile or contour. The reinforcement structure 13 can have a pyramid or pyramid-like structure. The reinforcement structure 13 can have a cone or cone-like structure. The reinforcement structure 13 has a substantially, relatively greater volume adjacent to the carrier 10. The portion 13b has a substantially, relatively greater volume than the portion 13t. The portion 13b has a substantially greater surface area than the portion 13t. The reinforcement structure 13 tapers from the portion 13b toward the portion 13t. The reinforcement structure 13 tapers toward the reinforcement structure 15.

The reinforcement structure 15 can include, for example but is not limited to, rubber or other relatively flexible, deformable, or elastic material. The reinforcement structure 15 can have a CTE ranged from approximately 50.0 ppm/° C. to approximately 70.0 ppm/° C. The reinforcement structure 15 can have a CTE greater than the reinforcement structure 13. The reinforcement structure 15 can have a Young's modulus (or Young modulus) less than the reinforcement structure 13.

The reinforcement structure 15 can be disposed on the reinforcement structure 13. The reinforcement structure 15 can be disposed on the reinforcement structure 13 by the bonding layer 14. The reinforcement structure 15 can be attached to or bonded to the reinforcement structure 13 by the bonding layer 14. The reinforcement structure 15 can have a CTE substantially greater than the reinforcement structure 13. The reinforcement structure 15 can have a constant width. The reinforcement structure 15 can have a portion 15b adjacent to the bonding layer 14. The reinforcement structure 15 can have a portion 15t on the portion 15b. The portion 15t can be exposed by the encapsulant 16. The reinforcement structure 15 can have a rectangular profile or contour. The reinforcement structure 15 can have a pillar or post structure. The reinforcement structure 15 can have a cylinder, cylinder-like or square column structure.

The bonding layer 14 can be disposed between the reinforcement structure 13 and the reinforcement structure 15. The bonding layer 14 can include adhesive material. The bonding layer 14 can include film type or gel type material. The bonding layer 14 can be disposed elevationally, substantially different from the surface 11b of the electronic device 11 by a distance from approximately one fourth of the thickness of the electronic device 11 to approximately one third of the thickness of the electronic device 11. The bonding layer 14 can be disposed elevationally, substantially different from the surface 12b of the electronic device 12 by a distance from approximately one fourth of the thickness of the electronic device 12 to approximately one third of the thickness of the electronic device 12.

The encapsulant 16 can be disposed on the carrier 10. The encapsulant 16 can encapsulate the carrier 10. The encapsulant 16 can encapsulate the electronic device 11. The encapsulant 16 can encapsulate the electronic device 12. The encapsulant 16 can encapsulate the reinforcement structure 13. The encapsulant 16 can encapsulate the reinforcement structure 15. The encapsulant 16 can encapsulate the bonding layer 14.

The encapsulant 16 can include a surface 16t. The encapsulant 16 can include a surface 16b opposite the surface 16t. The surface 16b can be adjacent to the carrier 10. The encapsulant 16 can expose the reinforcement structure 15. The encapsulant 16 can expose the electronic device 11. The encapsulant 16 can expose the electronic device 12. The encapsulant 16 can include epoxy or epoxy-based material. The encapsulant 16 can include fillers or particles. The encapsulant 16 can have a CTE ranged from approximately 6.0 ppm/° C. to approximately 13.0 ppm/° C.

The reinforcement structure 13 can be disposed adjacent to the surface 16b of the encapsulant 16. The reinforcement structure 15 can be disposed adjacent to the surface 16t of the encapsulant 16. The reinforcement structure 13 can be disposed in direct contact with the carrier 10. The reinforcement structure 13 can be disposed in direct contact with the passivation layer 101.

An imagenary surface or line MM', which can be substantially in parallel to the surface 11b of the electronic device 11, may pass the centroid C of the semiconductor package structure 1. An imagenary surface or line MM', which can be substantially in parallel to the surface 12b of the electronic device 12, may pass the centroid C of the semiconductor package structure 1. The position of the imagenary surface can be varied as the position of the centroid C of the semiconductor package structure 1 changes. For example, if the centroid C of the semiconductor package structure 1 goes down or lower (not shown or denoted in FIG. 1), an imagenary surface or line mm', which can be substantially in parallel to the surface 11b of the electronic device 11, may pass the centroid of the semiconductor package structure 1. Elevation of the imagenary surface can be changed from the imagenary surface MM' to the imagenary surface mm', or vice versa. In other words, the imagenary surface or mm' can be determined by the position of the centroid C of the semiconductor package structure 1

The reinforcement structure 15 can be disposed on the imagenary surface MM' or mm'. The surface 15b of the reinforcement structure 15 can be coplanar with the imagenary surface MM'. The reinforcement structure 15 can be disposed elevationally, substantially same to the imagenary surface or line MM'. The reinforcement structure 15 can be disposed elevationally, substantially greater than the imagenary surface or line mm'.

The imaginary surface MM' or mm' can be disposed elevationally, substantially different from the surface 11b of the electronic device 11 by a distance from approximately one fourth of the thickness of the electronic device 11 to approximately one third of the thickness of the electronic device 11. The imaginary surface MM' or mm' can be disposed elevationally, substantially different from the surface 12b of the electronic device 12 by a distance from approximately one fourth of the thickness of the electronic device 12 to approximately one third of the thickness of the electronic device 12. The imaginary surface mm' can pass through the reinforcement structure 13.

The connection elements 17 can include solder material or other suitable bonding material(s).

FIG. 1A, FIG. 1B, FIG. 1C, FIG. 1D, FIG. 1E, FIG. 1F, FIG. 1G, FIG. 1H, FIG. 1I, FIG. 1J and FIG. 1K illustrates cross sections of a semiconductor package structure during various manufacturing operations in accordance with some embodiments of the present disclosure.

Figure 1A:
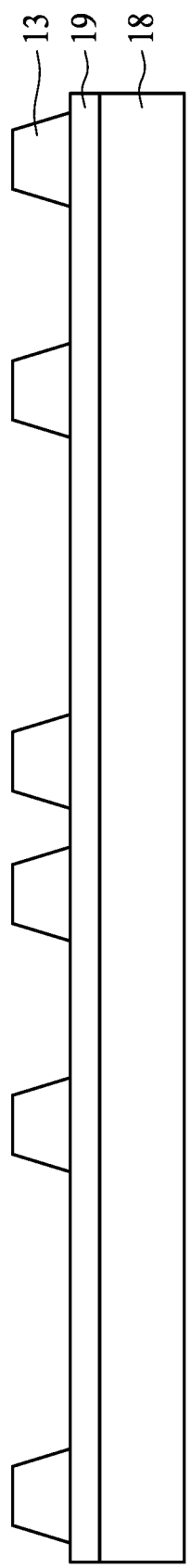
FIG. 1A, FIG. 1B, FIG. 1C, FIG. 1D, FIG. 1E, FIG. 1F, FIG. 1G, FIG. 1H, FIG. 1I, FIG. 1J and FIG. 1K illustrates cross sections of a semiconductor package structure during various manufacturing operations in accordance with some embodiments of the present disclosure.

Referring to FIG. 1A, a carrier 18 is provided. An adhesive layer or tape layer 19 is formed on the carrier 18. Some reinforcement structures 13 are formed on the adhesive layer 19.

Figure 1B:
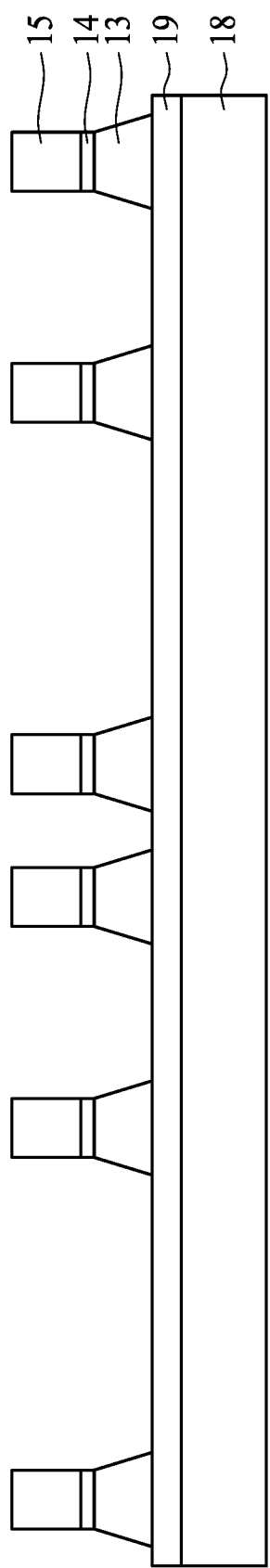

Referring to FIG. 1B, a bonding layer 14 is formed on the reinforcement structures 13. Some reinforcement structures 15 are formed on the bonding layer 14.

Figure 1C:
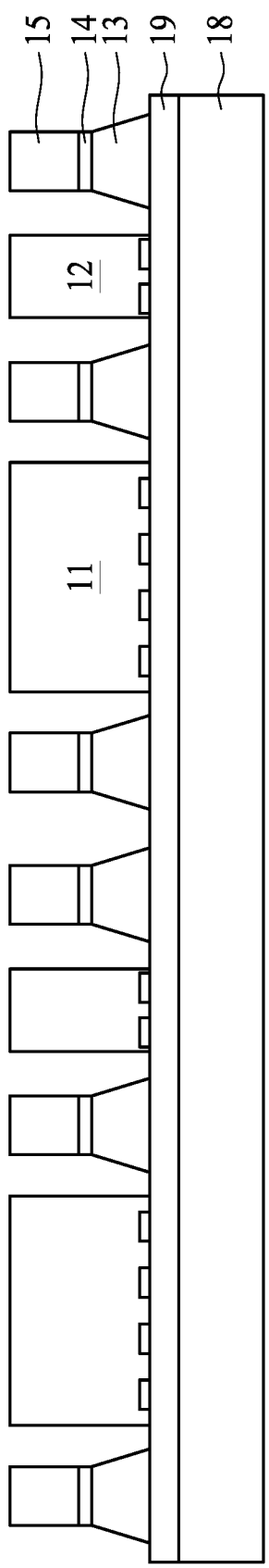

Referring to FIG. 1C, some electronic devices 11 and 12 are disposed on the adhesive layer 19.

Figure 1D:
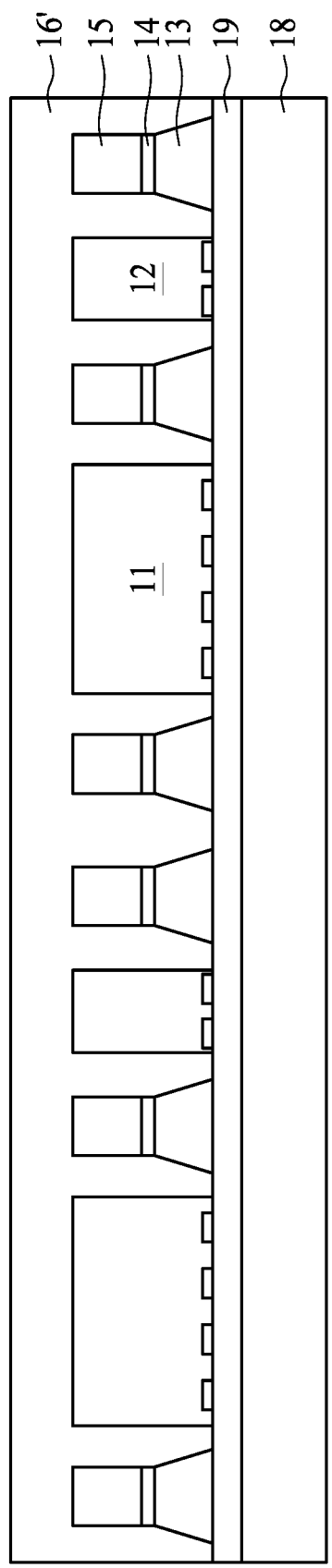

Referring to FIG. 1D, an encapsulant 16' is formed on the adhesive layer 19.

Figure 1E:
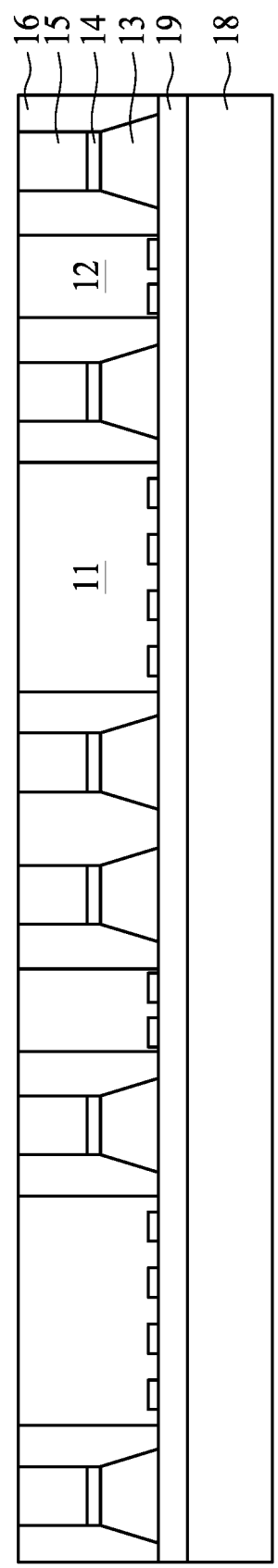

Referring to FIG. 1E, a part of the encapsulant 16' as shown in FIG. 1D is removed to form an encapsulant 16 to expose the reinforcement structures 15 and the electronic devices 11 and 12.

Figure 1F:
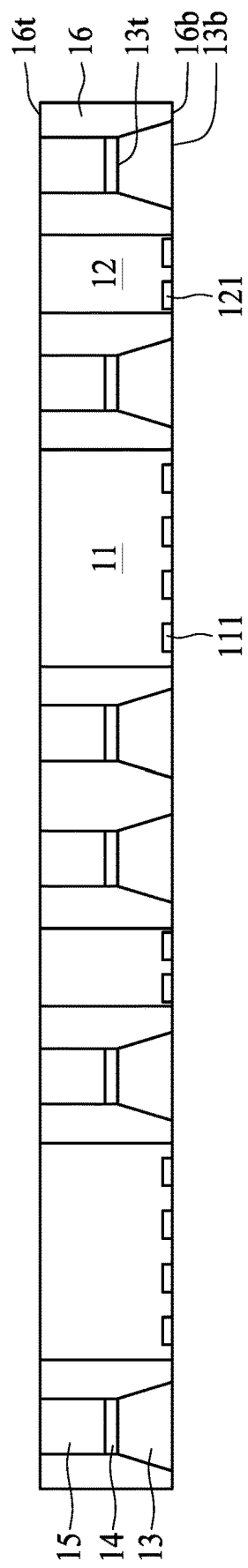

Referring to FIG. 1F, the adhesive layer 19 and the carrier 18 are removed.

Figure 1G:
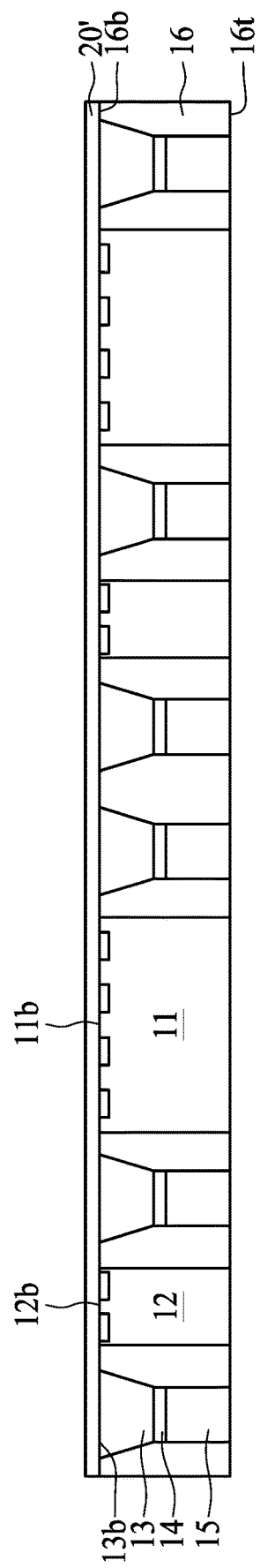

Referring to FIG. 1G, a mask 20' is formed on the surface 16b of the encapsulant 16.

Figure 1H:
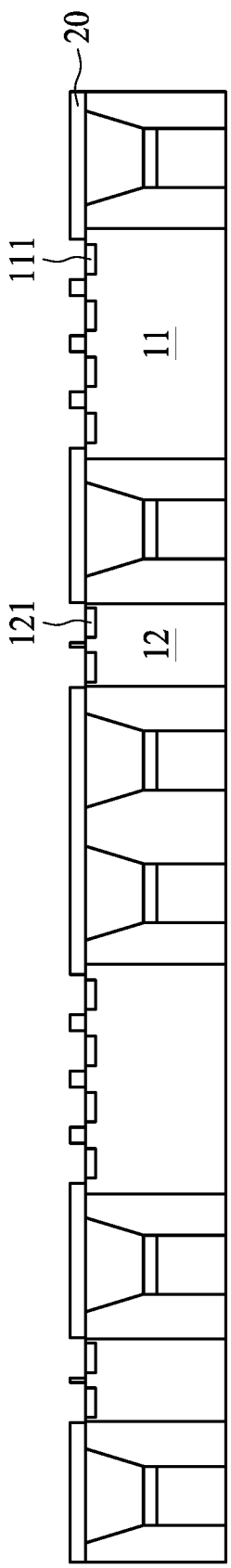

Referring to FIG. 1H, the mask 20' as shown in FIG. 1G is patterned to form a patterned mask 20 to expose the conductive pads 121 of the electronic device 12 and the conductive pads 111 of the electronic device 11.

Figure 1I:
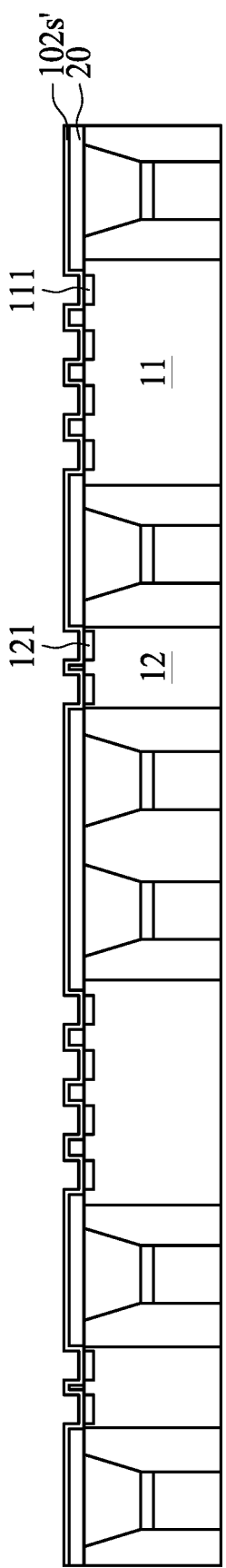

Referring to FIG. 1I, a conductive layer or seed layer 102s' is formed.

Figure 1J:
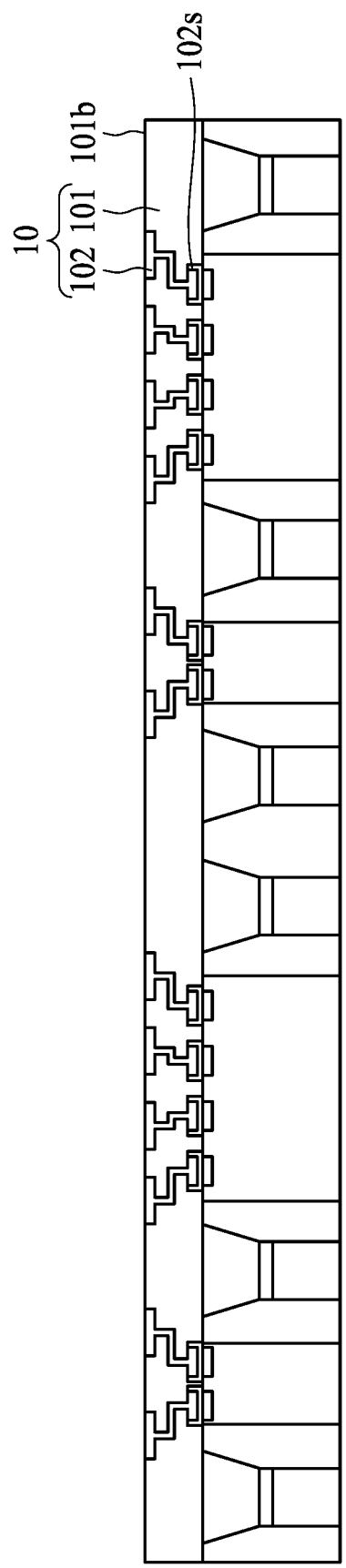

Referring to FIG. 1J, a part of the seed layer 102s' is removed to form the seed layer 102s to help forming an RDL 10 on the surface 16b of the encapsulant 16. During the operation of forming passivation layer 101, which can have a multilayer structure, the structure as show in FIG. 1J can go through thermal cycles, which may cause the overall structure to warp. Thanks to reinforcement structures 13 and 15, which can compensate for the stress (e.g. resulted from CTE mismatch) to mitigate or eliminate warpage.

For example, the relatively rigid reinforcement structures 13, which have a relatively great volume adjacent to the surface 16b of the encapsulant 16, can counter the stress resulted from thermal cycles. For example, the relatively elastic reinforcement structures 15, which are disposed adjacent to the surface 16t of the encapsulant 16, can counter the stress resulted from thermal cycles. Moreover, the relatively elastic reinforcement structures 15, which have a constant width, can prevent overcompensation to the stress. The relatively elastic reinforcement structures 15, which have a cylinder or cylinder-like structure, can avoid or mitigate delamination of the reinforcement structures 15 from the encapsulant 16. The relatively elastic reinforcement structures 15, which have a square column structure, can improve compensation for the stress caused during manufacturing.

Figure 1K:
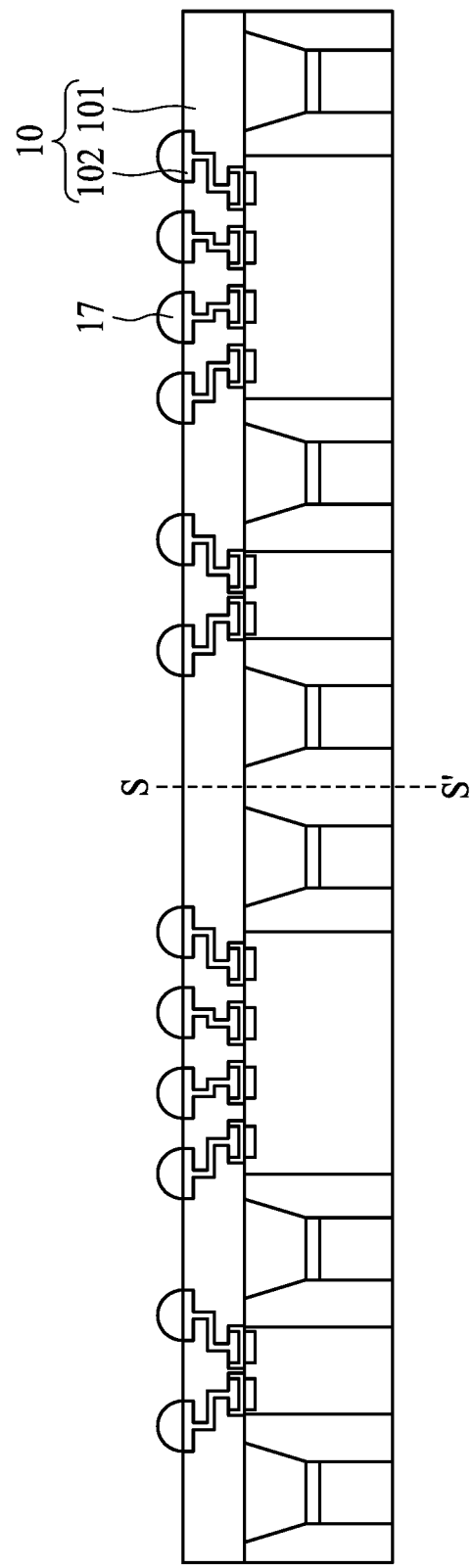

Referring to FIG. 1K, some connection elements 17 are formed on the RDL 10. A singulation or cutting technique can be performed along the scribe lines SS' to form some semiconductor package structures 1 as shown in FIG. 1.

Figure 2:
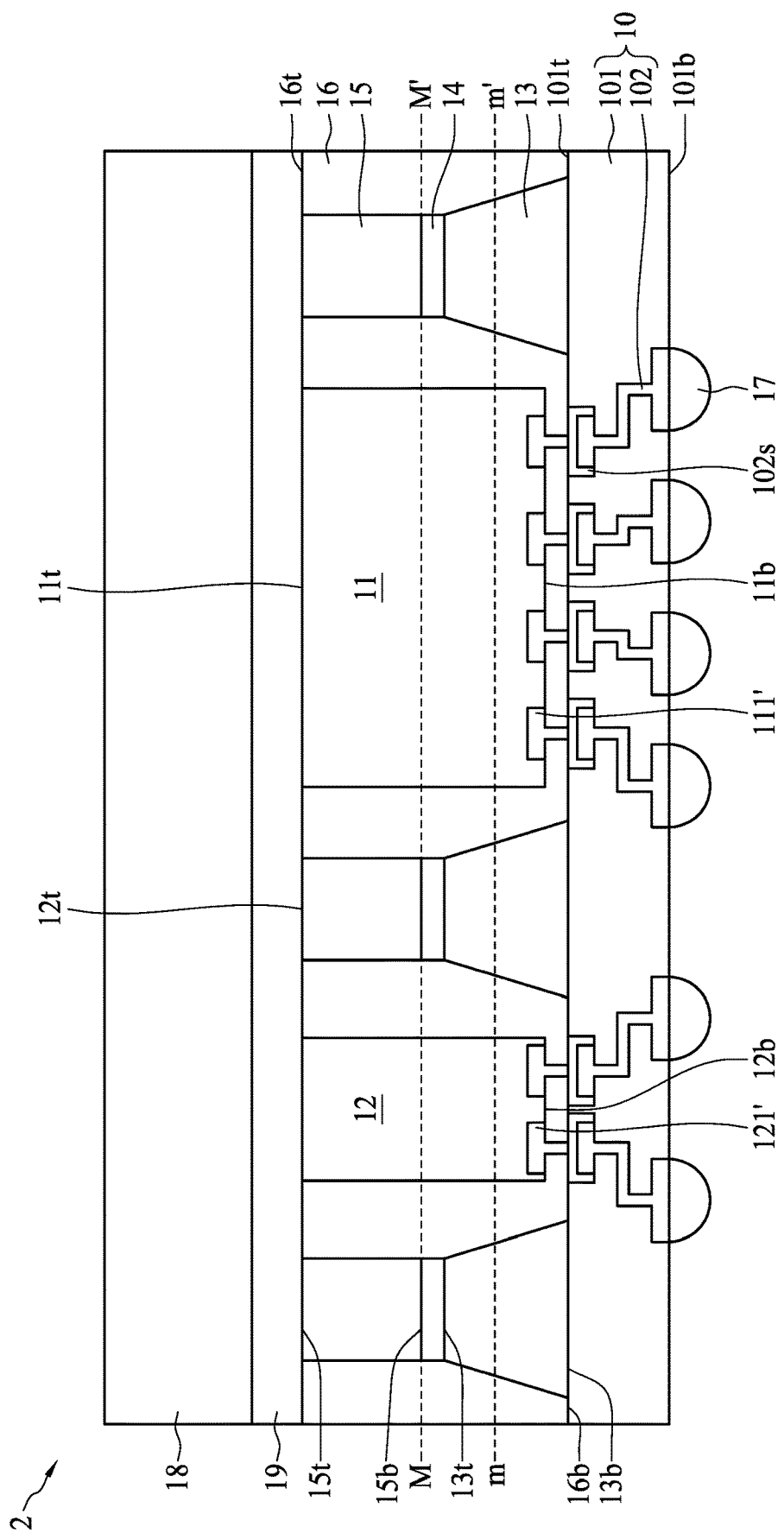
FIG. 2 illustrates a cross-sectional view of a semiconductor package structure in accordance with some embodiments of the present disclosure.

FIG. 2 illustrates a cross-sectional view of a semiconductor package structure in accordance with some embodiments of the present disclosure.

Referring to FIG. 2, the semiconductor package structure 2 is similar to the semiconductor package structure 1 as described and illustrated with reference to FIG. 1, except that the semiconductor package structure 2 further includes an adhesive layer 19 and a carrier 20, and the conductive pads 111 and 121 are replaced by conductive pads 111' and 121', respectively.

The electronic device 11 can be spaced apart from the passivation layer 101. The electronic device 12 can be spaced apart from the passivation layer 101. The encapsulant 16 can extend into the space between the electronic device 11 and the passivation layer 101. The encapsulant 16 can extend into the space between the electronic device 12 and the passivation layer 101. The conductive pad 111' can have a pillar (not denoted in FIG. 2). The conductive pad 121' can have a pillar (not denoted in FIG. 2).

The carrier 18 can include, for example but is not limited to, copper (Cu) or other suitable material(s) to facilitate heat dissipation.

FIG. 2A, FIG. 2B, FIG. 2C, FIG. 2D, FIG. 2E, FIG. 2F, FIG. 2G, FIG. 2H, and FIG. 2I illustrates cross sections of a semiconductor package structure during various manufacturing operations in accordance with some embodiments of the present disclosure.

Figure 2A:
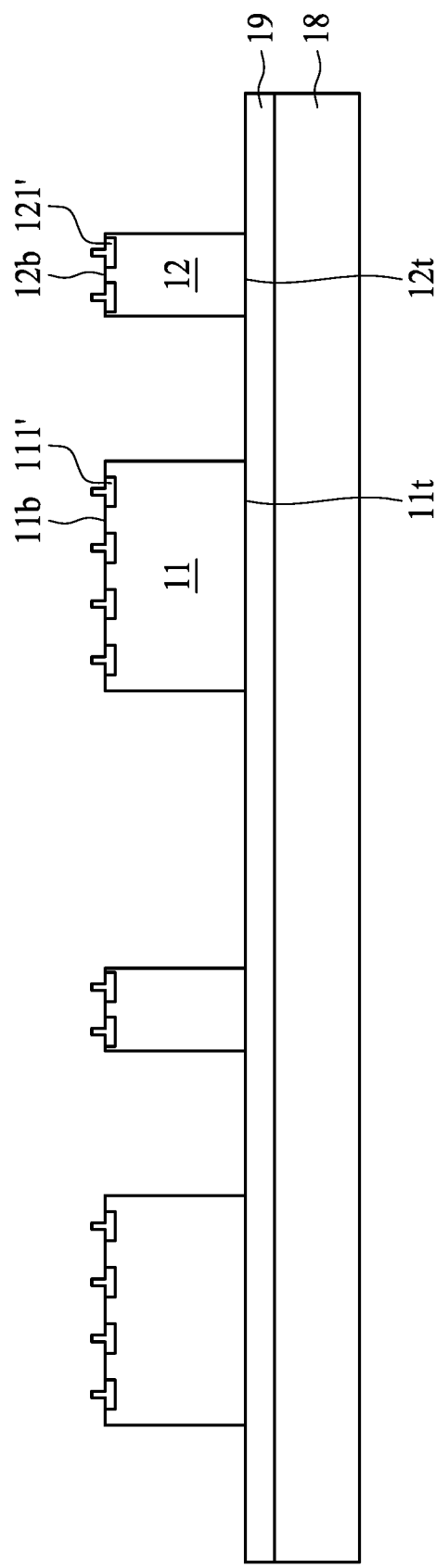
FIG. 2A, FIG. 2B, FIG. 2C, FIG. 2D, FIG. 2E, FIG. 2F, FIG. 2G, FIG. 2H, and FIG. 2I illustrates cross sections of a semiconductor package structure during various manufacturing operations in accordance with some embodiments of the present disclosure.

Referring to FIG. 2A, a carrier 18 is provided. An adhesive layer or tape layer 19 is formed on the carrier 18. Some electronic devices 11 and 12 are disposed on the adhesive layer 19.

Figure 2B:
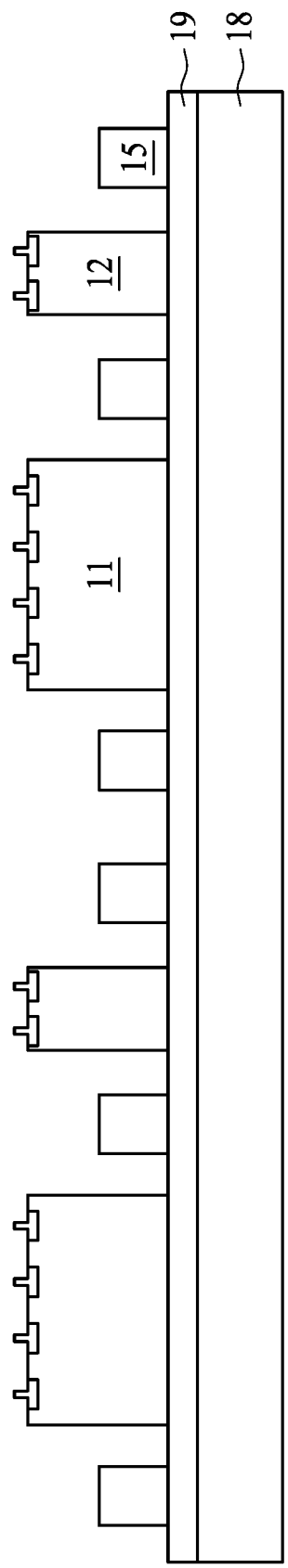

Referring to FIG. 2B, some reinforcement structures 15 are formed on the adhesive layer 19.

Figure 2C:
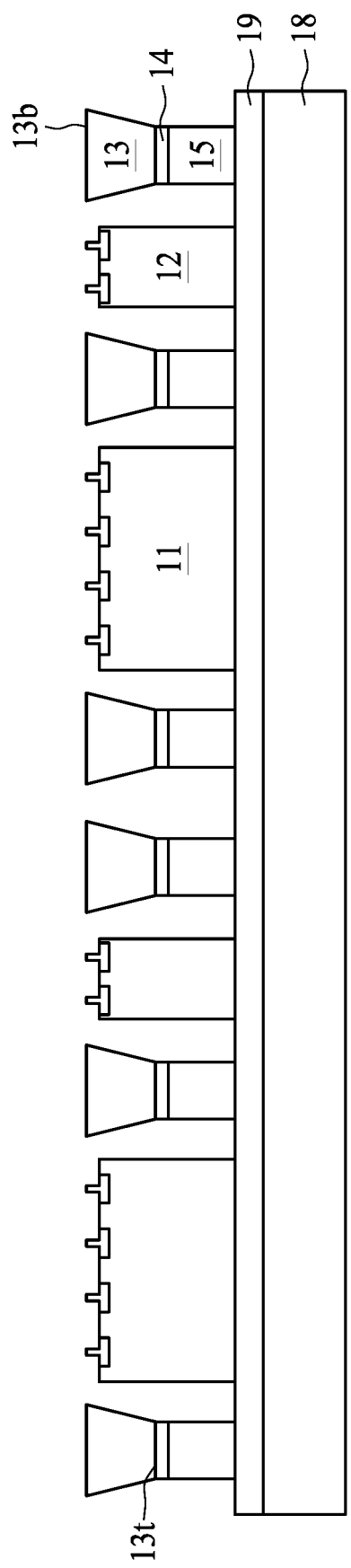

Referring to FIG. 2C, some reinforcement structures 13 are disposed on the reinforcement structures 15 by a bonding layer 14.

Figure 2D:
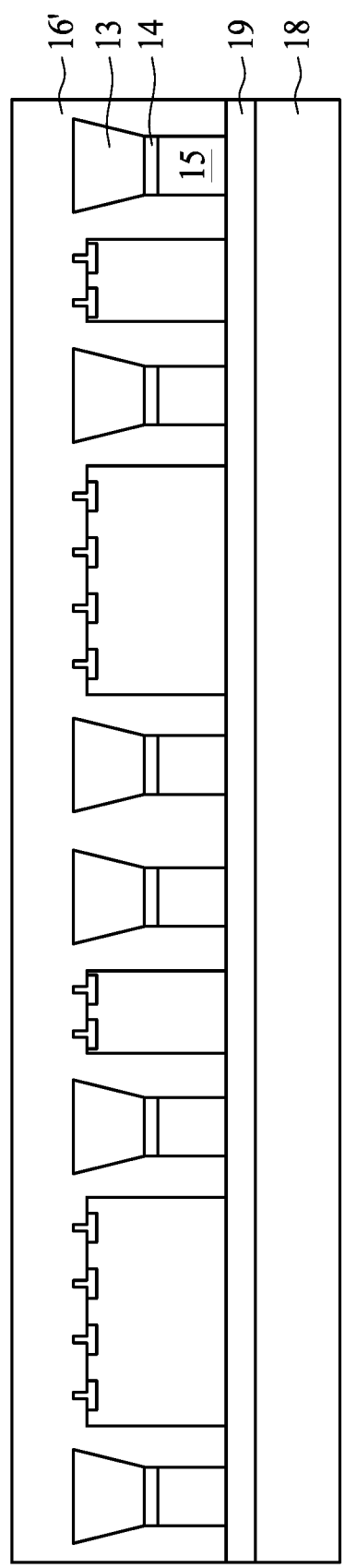

Referring to FIG. 2D, an encapsulant 16' is formed on the adhesive layer 19.

Figure 2E:
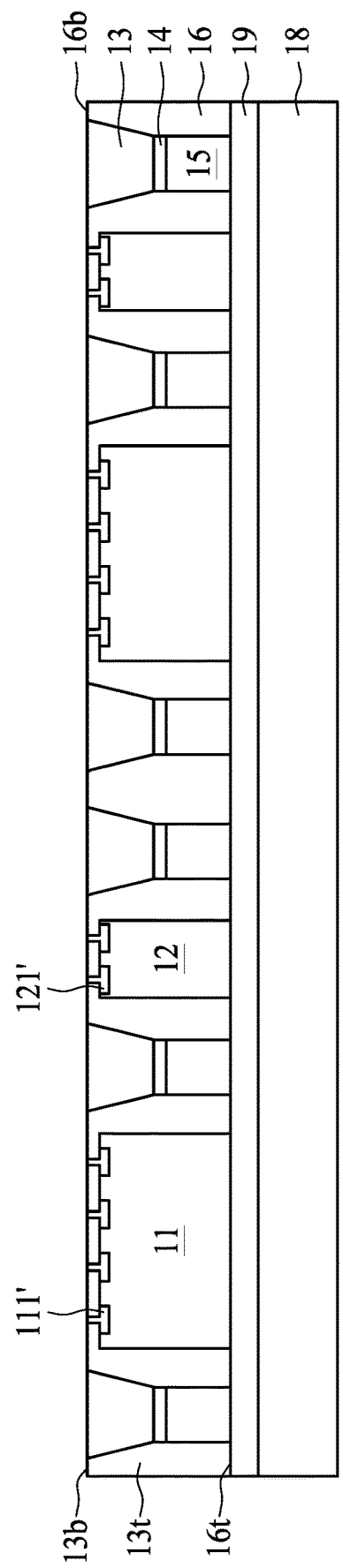

Referring to FIG. 2E, a part of the encapsulant 16' as shown in FIG. 2D is removed to form an encapsulant 16 to expose the reinforcement structures 13 and the electronic devices 11 and 12.

Figure 2F:
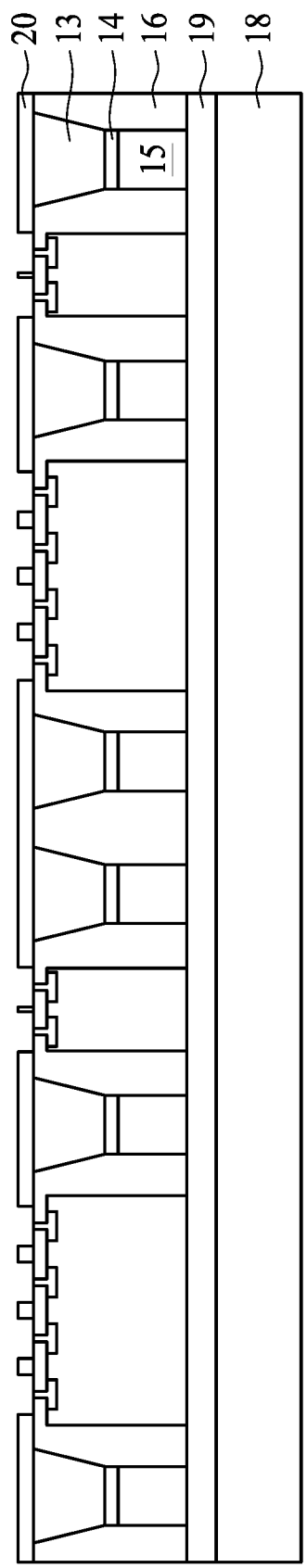

Referring to FIG. 2F, a patterned mask 20 is formed on the surface 16b of the encapsulant 16.

Figure 2G:
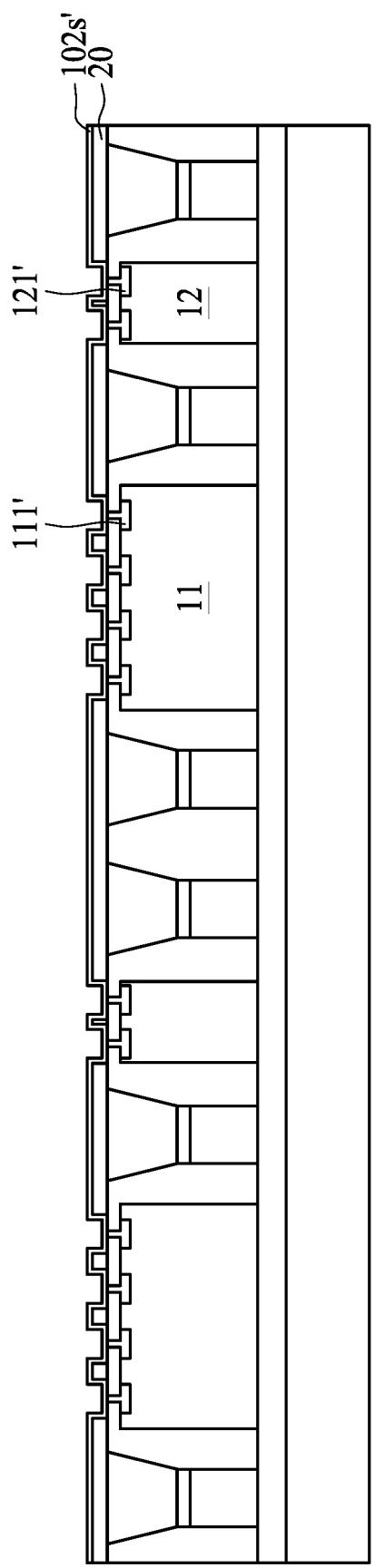

Referring to FIG. 2G, a conductive layer or seed layer 102s' is formed.

Figure 2H:
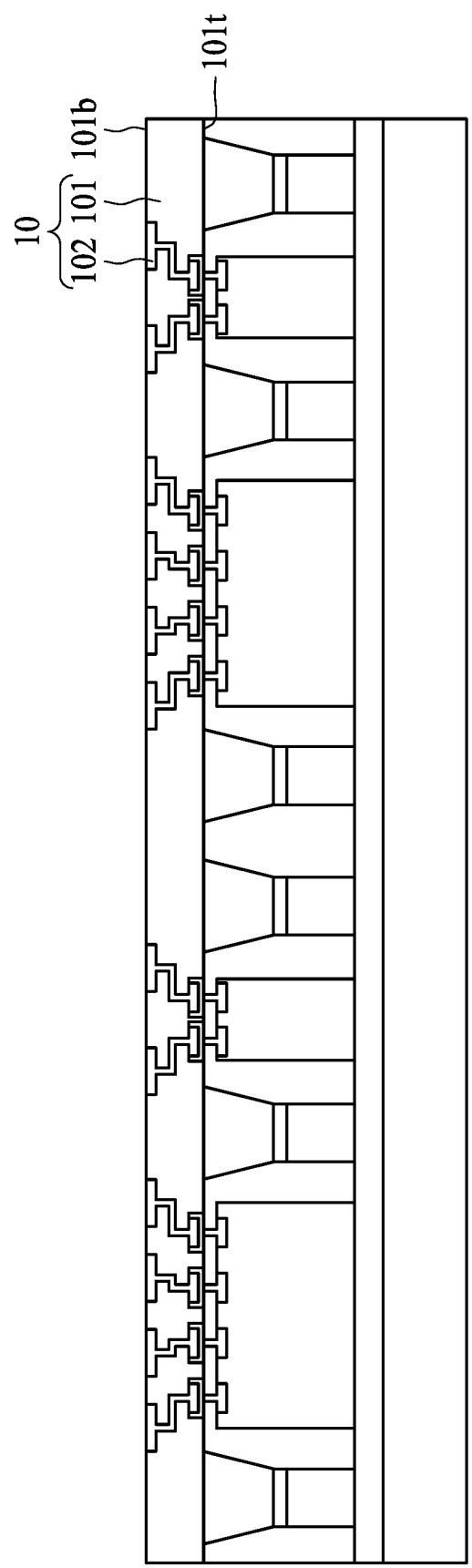

Referring to FIG. 2H, a part of the seed layer 102s' is removed to form the seed layer 102s to help forming an RDL 10 on the surface 16b of the encapsulant 16. During the operation of forming passivation layer 101, which can have a a single-layer or multilayer structure, the structure as show in FIG. 2H can go through thermal cycles, which may cause the overall structure to warp. Thanks to reinforcement structures 13 and 15, which can compensate for the stress (e.g. resulted from CTE mismatch) to mitigate or eliminate warpage.

For example, the relatively rigid reinforcement structures 13, which have a relatively great volume adjacent to the surface 16b of the encapsulant 16, can counter the stress resulted from thermal cycles. For example, the relatively elastic reinforcement structures 15, which are disposed adjacent to the surface 16t of the encapsulant 16, can counter the stress resulted from thermal cycles. Moreover, the relatively elastic reinforcement structures 15, which have a constant width, can prevent overcompensation to the stress. The relatively elastic reinforcement structures 15, which have a cylinder or cylinder-like structure, can avoid or mitigate delamination of the reinforcement structures 15 from the encapsulant 16. The relatively elastic reinforcement structures 15, which have a square column structure, can improve compensation for the stress caused during manufacturing.

Figure 2I:
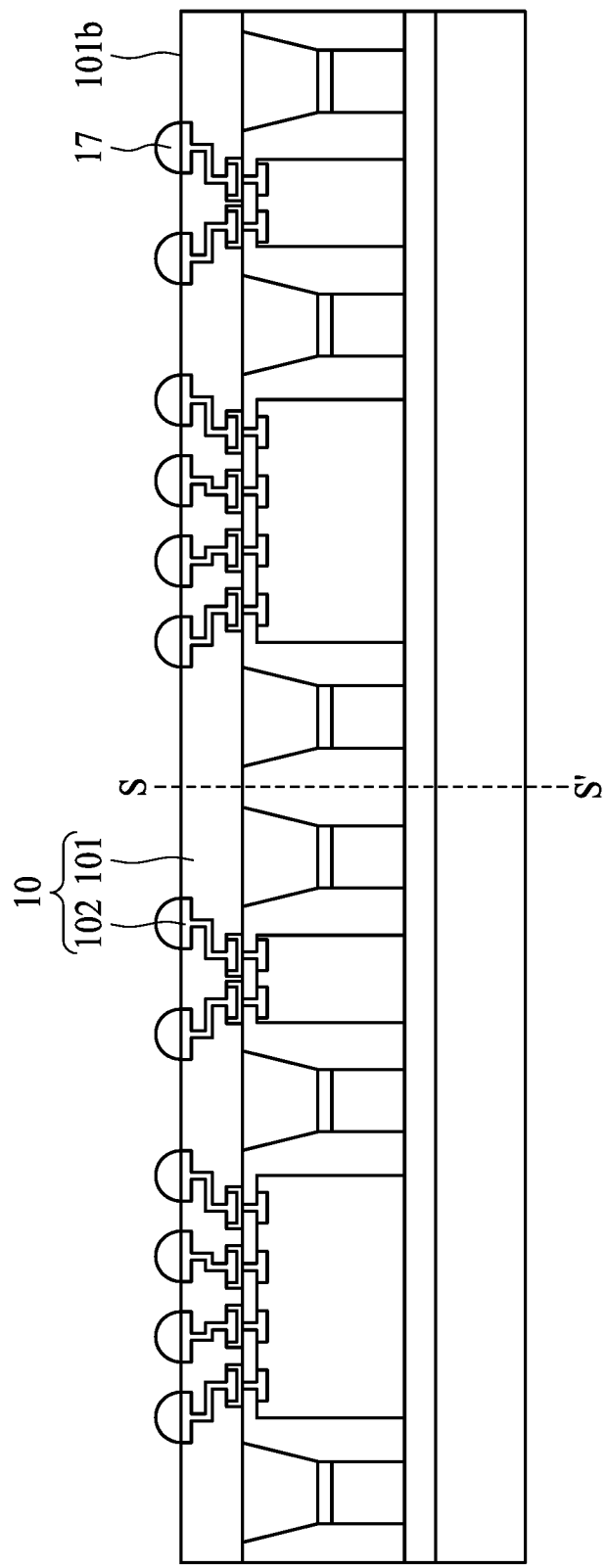

Referring to FIG. 2I, some connection elements 17 are formed on the RDL 10. A singulation or cutting technique can be performed along the scribe lines SS' to form some semiconductor package structures 2 as shown in FIG. 2.

Figure 3:
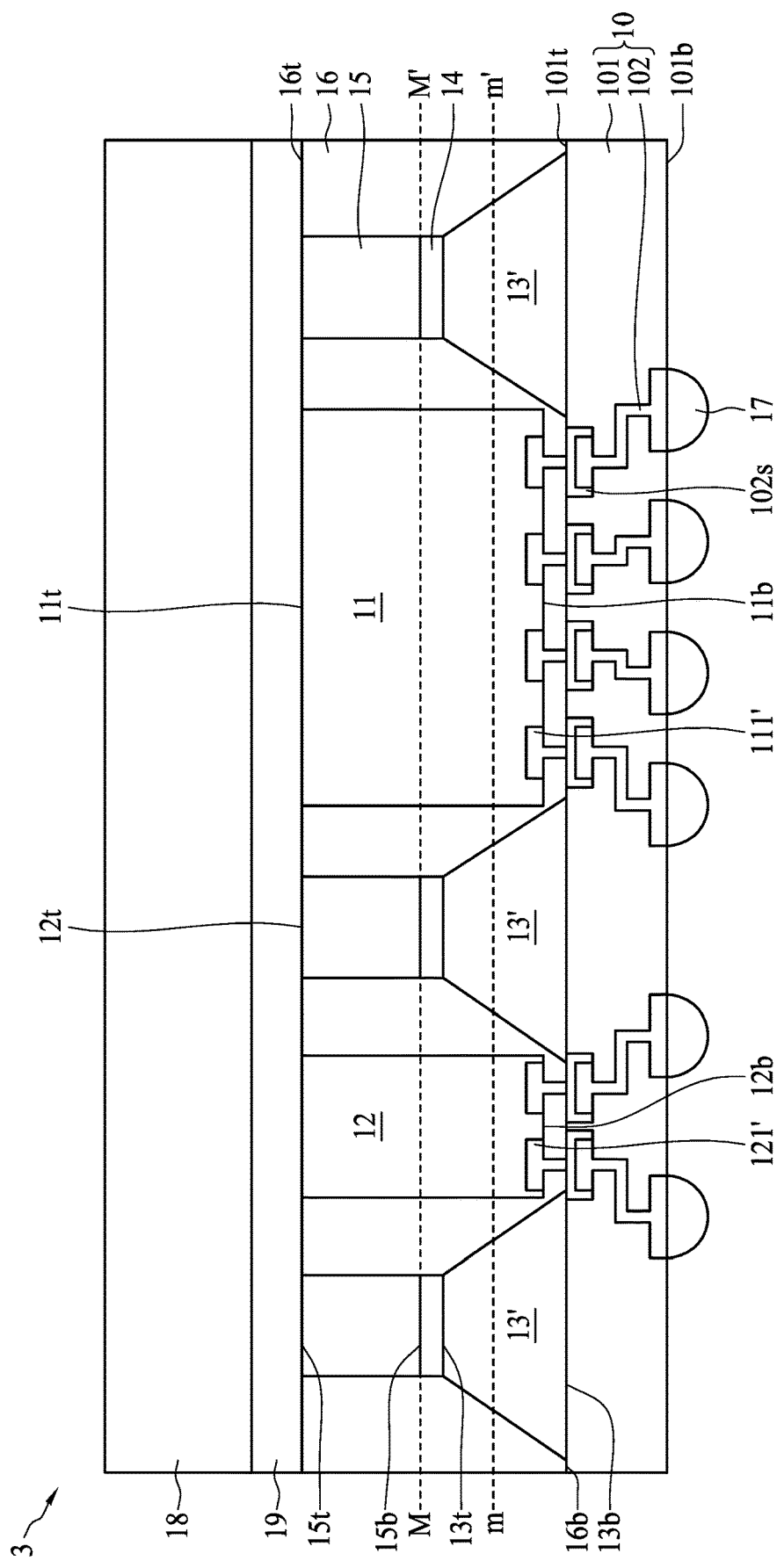
FIG. 3 illustrates a cross-sectional view of a semiconductor package structure in accordance with some embodiments of the present disclosure.

FIG. 3 illustrates a cross-sectional view of a semiconductor package structure in accordance with some embodiments of the present disclosure.

Referring to FIG. 3, the semiconductor package structure 3 is similar to the semiconductor package structure 2 as described and illustrated with reference to FIG. 2, except that the reinforcement structures 13 of the semiconductor package structure 2 are replaced by the reinforcement structures 13' to form the semiconductor package structure 3.

The reinforcement structures 13' can extend into the space between the electronic device 11 and the passivation layer 101. The reinforcement structures 13' can extend into the space between the electronic device 12 and the passivation layer 101.

Figure 4:
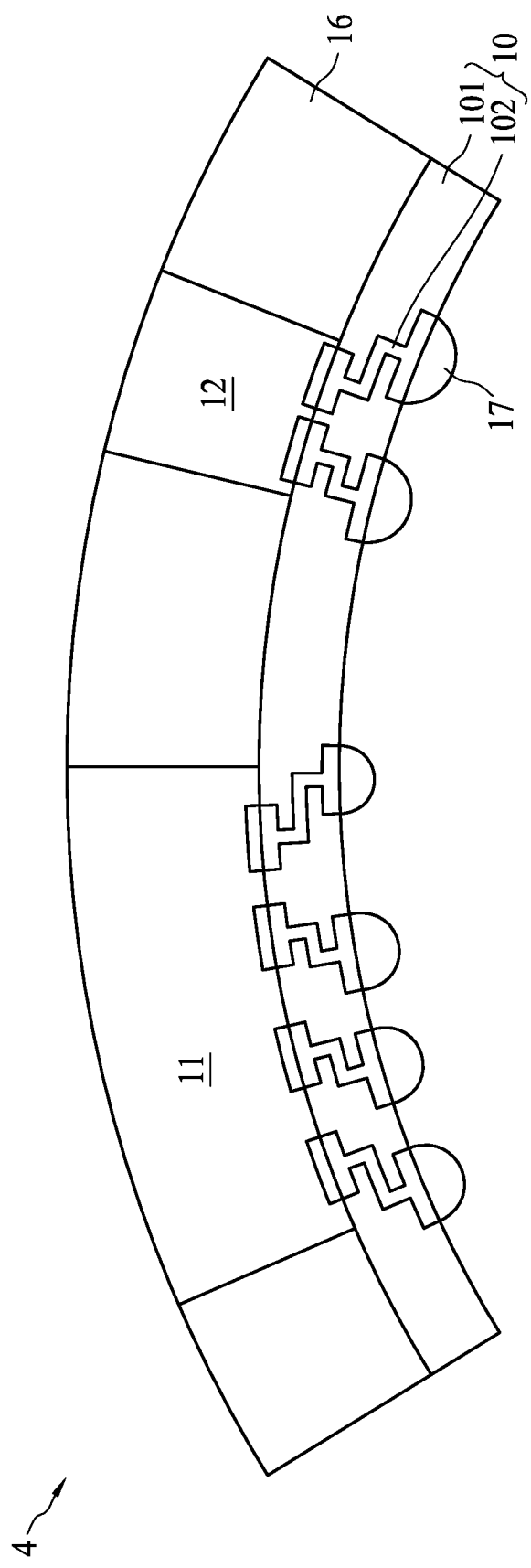
FIG. 4 illustrates a cross-sectional view of a semiconductor package structure in accordance with some embodiments of the present disclosure.

FIG. 4 illustrates a cross-sectional view of a semiconductor package structure in accordance with some embodiments of the present disclosure.

Referring to FIG. 4, the semiconductor package structure 4 can include a carrier 10, electronic devices 11 and 12, encapsulant 16 and connection elements 17. The semiconductor package structure 4 may warp due to stress generated in some operations of manufacturing. It can be observed that there is a difference in elevation between a geometric center of the encapsulant 16 (not denoted in FIG. 4) and periphery (or edge).

FIG. 4A, FIG. 4B, FIG. 4C, FIG. 4D, FIG. 4E and FIG. 4F illustrates cross sections of a semiconductor package structure during various manufacturing operations in accordance with some embodiments of the present disclosure.

Figure 4A:
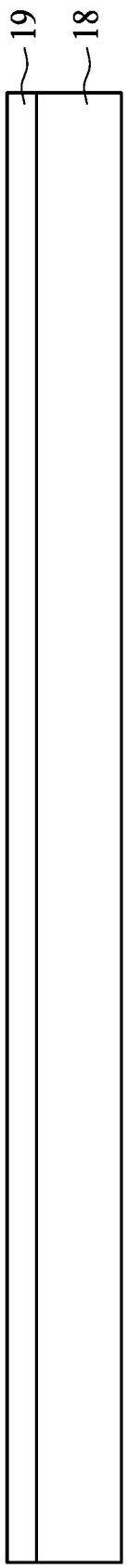
FIG. 4A, FIG. 4B, FIG. 4C, FIG. 4D, FIG. 4E and FIG. 4F illustrates cross sections of a semiconductor package structure during various manufacturing operations in accordance with some embodiments of the present disclosure.

Referring to FIG. 4A, a carrier 18 is provided. An adhesive layer or tape layer 19 is formed on the carrier 18.

Figure 4B:
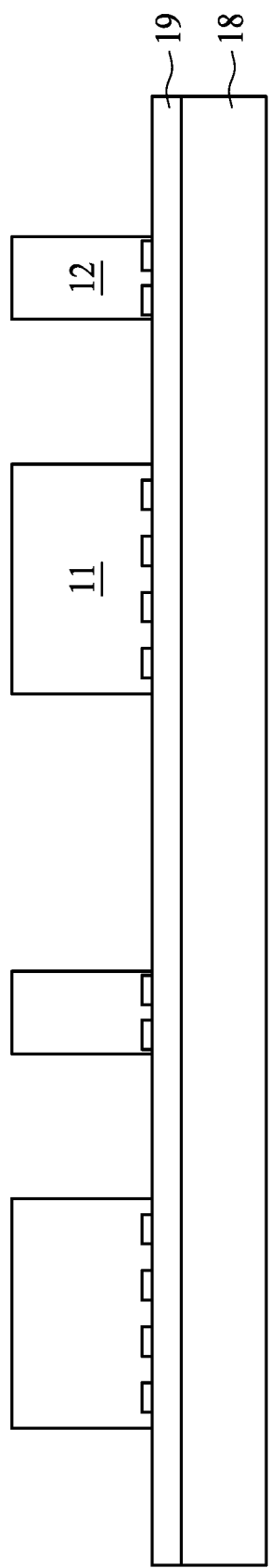

Referring to FIG. 4B, some electronic devices 11 and 12 are disposed on the adhesive layer 19.

Figure 4C:
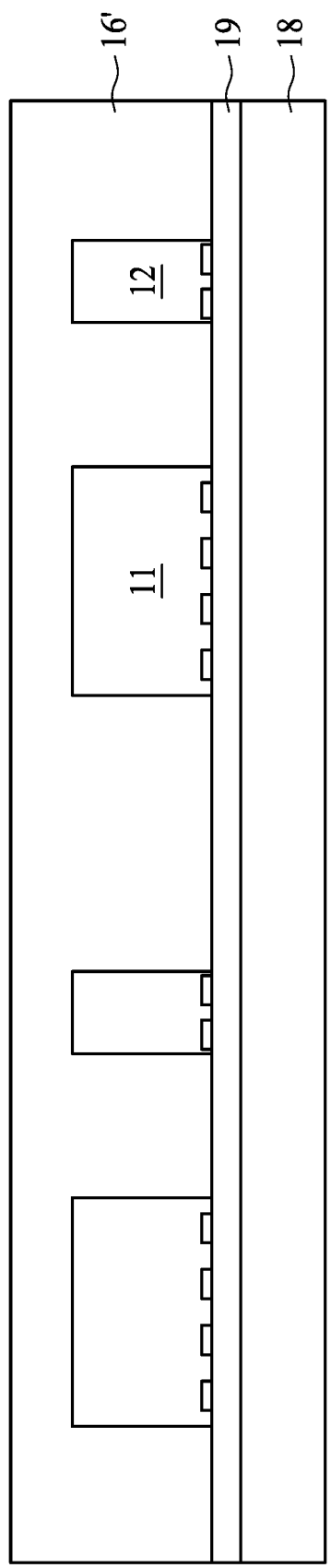

Referring to FIG. 4C, an encapsulant 16' is formed on the adhesive layer 19.

Figure 4D:

Referring to FIG. 4D, a part of the encapsulant 16' as shown in FIG. 4C is removed to form an encapsulant 16 to expose the electronic devices 11 and 12.

Figure 4E:
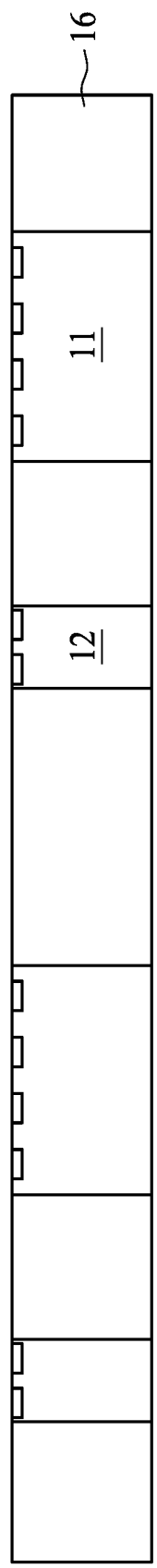

Referring to FIG. 4E, the structure as shown in FIG. 4D is turned upside down.

Figure 4F:
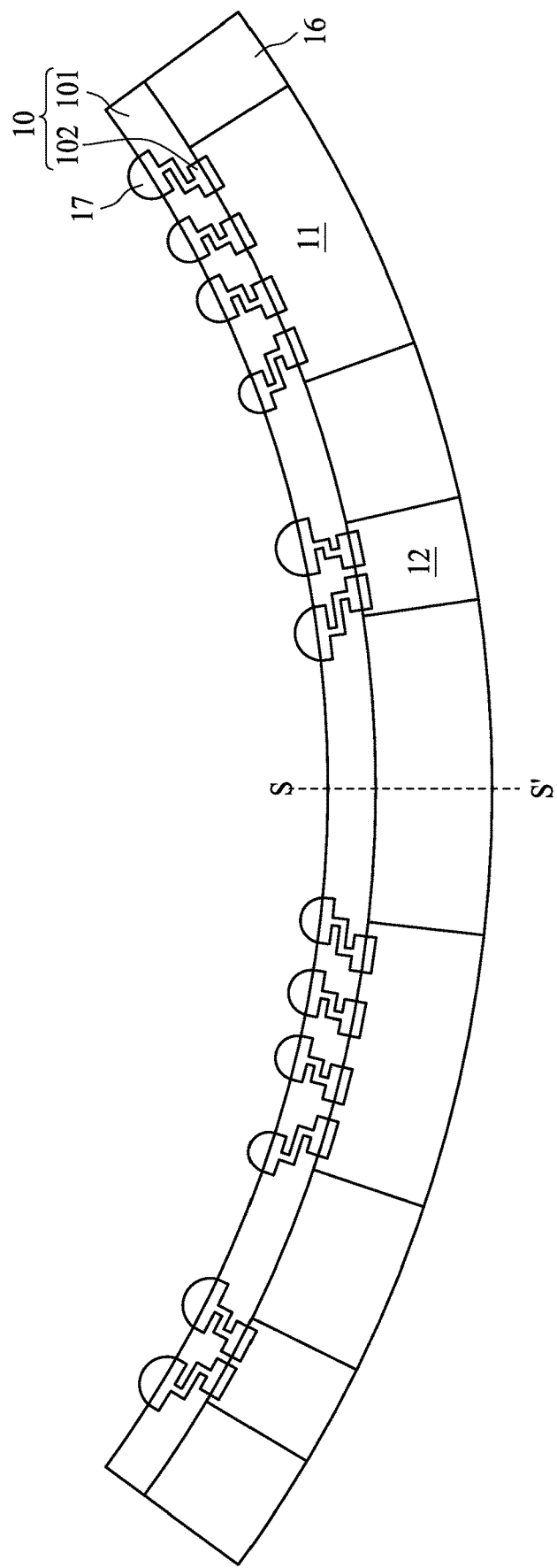

Referring to FIG. 4F, an RDL 10 is formed on the encapsulant 16. During the operation of forming passivation layer 101, which can have a single-layer or multilayer structure, the structure as show in FIG. 4F can go through thermal cycles, which may cause the overall structure to warp.

For example, during the operation of forming a single-layer passivation layer 101, there may be a difference of approximately 200 micrometer (μm) in elevation between a geometric center of the encapsulant 16 (not denoted in FIG. 4) and periphery (or edge). For example, during the operation of forming a two-layer passivation layer 101, there may be a difference of approximately 600 μm in elevation between a geometric center of the encapsulant 16 (not denoted in FIG. 4) and periphery (or edge). For example, during the operation of forming a three-layer passivation layer 101, there may be a difference of approximately 1200 μm in elevation between a geometric center of the encapsulant 16 (not denoted in FIG. 4) and periphery (or edge). For example, during the operation of forming a five-layer passivation layer 101, there may be a difference greater than approximately 3000 μm in elevation between a geometric center of the encapsulant 16 (not denoted in FIG. 4) and periphery (or edge).

In other words, accumulation of the passivation layer 101 can cause relatively severe CTE mismatch between the encapsulant 16 and the passivation layer 101, Some connection elements 17 are formed on the RDL 10. A singulation or cutting technique can be performed along the scribe lines SS' to form some semiconductor package structures 4 as shown in FIG. 4.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package structure, comprising:
   a redistribution layer (RDL) structure having a passivation layer and a patterned conductive layer disposed in the passivation layer;
   a first electronic device disposed on the RDL structure;
   a first reinforcement structure disposed on the RDL structure and having a first modulus;
   a second reinforcement structure disposed on the first reinforcement structure and having a second modulus substantially less than the first modulus; and
   an encapsulant disposed on the RDL structure and encapsulating the first electronic device, the first reinforcement structure and the second reinforcement structure.

2. The semiconductor package structure of claim 1, wherein the first reinforcement structure comprising a first portion adjacent to the RDL structure, and a second portion on the first portion, and wherein the first portion has a width substantially greater than the second portion from a cross sectional view perspective.

3. The semiconductor package structure of claim 1, wherein the first reinforcement structure comprising a first portion adjacent to the RDL structure, and a second portion on the first portion, and wherein the first portion has a surface area substantially greater than the second portion from a top view perspective.

4. The semiconductor package structure of claim 1, wherein the first modulus comprises Young's modulus, and the second modulus comprises Young's modulus.

5. The semiconductor package structure of claim 1, wherein the first reinforcement structure has a first coefficient of thermal expansion (CTE) and the second reinforcement structure has a second CTE substantially greater than the first CTE.

6. The semiconductor package structure of claim 1, wherein a space is between the first electronic device and the RDL structure, and wherein the first reinforcement structure extends in the space.

7. The semiconductor package structure of claim 1, further comprising a bonding layer between the first reinforcement structure and the second reinforcement structure.

8. A semiconductor package structure having a barycenter, the semiconductor package structure comprising:
   a passivation layer;
   an electronic device disposed on the passivation layer and having a first surface adjacent to the passivation layer;
   an encapsulant encapsulating the electronic device and having a first surface adjacent to the passivation layer and a second surface opposite the first surface of the encapsulant; and
   a first reinforcement structure disposed adjacent to the second surface of the encapsulant,
   wherein an imaginary surface substantially in parallel to the first surface of the electronic device passes the barycenter of the semiconductor package structure, and wherein the first reinforcement structure is disposed on the imaginary surface.

9. The semiconductor package structure of claim 8, wherein first reinforcement structure is disposed elevationally, substantially same or greater than the imaginary surface.

10. The semiconductor package structure of claim 8, wherein the electronic device has a first thickness, wherein the imaginary surface is disposed elevationally, substantially different from the first surface of the electronic device by a distance from approximately one fourth of the first thickness to approximately one third of the first thickness.

11. The semiconductor package structure of claim 8, further comprising a second reinforcement structure disposed adjacent to the first surface of the encapsulant and encapsulated by the encapsulant.

12. The semiconductor package structure of claim 11, wherein the second reinforcement structure is disposed in direct with the passivation layer.

13. The semiconductor package structure of claim 11, wherein the second reinforcement structure comprising a first portion adjacent to the passivation layer, and a second portion on the first portion, and wherein the first portion has a width greater than the second portion from a cross sectional view perspective.

14. The semiconductor package structure of claim 11, wherein the second reinforcement structure comprising a first portion adjacent to the passivation layer, and a second portion on the first portion, and wherein the first portion has a surface area greater than the second portion from a top view perspective.

15. The semiconductor package structure of claim 11, wherein the second reinforcement structure has a relatively great volume adjacent to the passivation layer.

16. The semiconductor package structure of claim 11, wherein the first reinforcement structure has a Young's modulus substantially less than the second reinforcement structure.

17. The semiconductor package structure of claim 11, wherein the electronic device is spaced apart from the passivation layer, and wherein the second reinforcement structure extends in a space between the electronic device and the passivation layer.

18. The semiconductor package structure of claim 8, wherein the electronic device has a first thickness, and wherein a bonding layer is disposed elevationally, substantially different from the first surface of the electronic device by a distance from approximately one fourth of the first thickness to approximately one third of the first thickness.

19. A method of manufacturing a semiconductor package structure, comprising:
providing a device including a carrier, a number of electronic devices on the carrier, a number of first reinforcement structures on the carrier; and
attaching the second reinforcement structure to each of the number of the first reinforcement structures by a bonding layer.

20. The semiconductor package structure of claim 1, further comprising a second electronic device, wherein the first reinforcement structure and the second reinforcement structure are between the first electronic device and the second electronic device.

21. The semiconductor package structure of claim 1, further comprising
an adhesive layer in contact with the second reinforcement structure and the first electronic device; and
a carrier in contact with the adhesive layer.

22. The semiconductor package structure of claim 21, wherein the encapsulant is in contact with the adhesive layer.

23. The semiconductor package structure of claim 1, wherein the second reinforcement structure includes elastic materials.

24. The method of claim 19, further comprising:
forming a passivation layer of the RDL structure directly on the second reinforcement structures.

25. The method of claim 19, further comprising:
forming an RDL structure on the number of electronic devices and the second reinforcement structures; and
encapsulating the number of electronic devices, the number of first reinforcement structures, and the second reinforcement structures.

26. The semiconductor package structure of claim 7, wherein the bonding layer includes insulating material.

* * * * *